United States Patent
Perez et al.

(10) Patent No.: US 6,907,557 B2
(45) Date of Patent: Jun. 14, 2005

(54) SYSTEM AND METHOD FOR TESTING A GROUP OF RELATED PRODUCTS

(75) Inventors: Hjalmar Perez, Austin, TX (US); Kurt Mandeville, Austin, TX (US); Paul Packebush, Austin, TX (US)

(73) Assignee: National Instruments Corporation, Austin, TX (US)

( * ) Notice: Subject to any disclaimer, the term of this patent is extended or adjusted under 35 U.S.C. 154(b) by 608 days.

(21) Appl. No.: 09/792,115

(22) Filed: Feb. 22, 2001

(65) Prior Publication Data

US 2002/0116666 A1 Aug. 22, 2002

(51) Int. Cl.⁷ .............................................. G01R 31/28
(52) U.S. Cl. ..................... 714/742; 702/119; 717/124
(58) Field of Search .................. 714/38, 742; 702/119, 702/123; 717/124, 125

(56) References Cited

U.S. PATENT DOCUMENTS

| | | | |
|---|---|---|---|
| 6,002,868 A | | 12/1999 | Jenkins et al. ............... 717/105 |
| 6,148,277 A | * | 11/2000 | Asava et al. ................... 703/22 |
| 6,401,220 B1 | * | 6/2002 | Grey et al. ..................... 714/33 |
| 6,421,634 B1 | * | 7/2002 | Dearth et al. ................. 703/14 |
| 6,434,503 B1 | * | 8/2002 | Sommer ....................... 702/123 |
| 6,449,744 B1 | | 9/2002 | Hansen ......................... 714/730 |
| 6,502,051 B1 | * | 12/2002 | Coyle ........................... 702/123 |
| 6,618,853 B1 | * | 9/2003 | Ohyama et al. ............. 717/109 |
| 6,654,911 B1 | * | 11/2003 | Miles ........................... 714/38 |
| 6,658,645 B1 | * | 12/2003 | Akuta et al. ................. 717/106 |
| 6,745,146 B1 | * | 6/2004 | Brown et al. ................ 702/123 |
| 6,804,634 B1 | * | 10/2004 | Holzmann et al. ............. 703/2 |
| 6,829,731 B1 | * | 12/2004 | LaFauci et al. ............... 714/33 |
| 2004/0221270 A1 | * | 11/2004 | Witchel et al. .............. 717/124 |

* cited by examiner

Primary Examiner—Scott Baderman
Assistant Examiner—Anne L. Damiano
(74) Attorney, Agent, or Firm—Meyertons Hood Kivlin Kowert & Goetzel, P.C.; Jeffrey C. Hood; Jason L. Burgess

(57) ABSTRACT

A system and method for testing a group of related products or devices. According to one embodiment, the user may first manually create a base test sequence, and child test sequences may then be created based on the base test sequence. The user may include various steps in the base test sequence, such that the base test sequence includes steps that need to be common to most or all of the child test sequences. The user may also configure parameters or properties for each step in the base test sequence, such that the parameter configuration is what is required for most or all of the child test sequences. Initial child test sequences may then be automatically created as instances of the base test sequence. The user may then manually edit the instances of the base test sequence to produce the desired child test sequences, such that each child test sequence is configured to appropriately test a particular product to which the child test sequence corresponds. For example, the user may change a parameter configuration for one or more steps in the child test sequence, may add a step to or remove a step from the child test sequence, etc. In the preferred embodiment, the child test sequences may also be automatically changed or updated in various ways. For example, the user may manually add a new step to the base test sequence, and in response the new step may be automatically added to each child test sequence. As another example, the user may manually change the parameter configuration for a step in the base test sequence, and in response the parameter configuration change may be automatically propagated to each child test sequence.

22 Claims, 5 Drawing Sheets

SYSTEM AND METHOD FOR TESTING A GROUP OF RELATED PRODUCTS

FIELD OF THE INVENTION

The present invention relates to the field of computer-based testing of products or devices, and more particularly to a system and method for testing a group of related products or devices.

DESCRIPTION OF THE RELATED ART

In modern testing environments, software referred to as "test executive" software may be used to control or perform tests. The test executive typically allows the user to organize and execute a sequence of test modules, e.g., via a graphical user interface. For example, a test sequence may comprise a series of steps, wherein each step references a test module, and wherein each test module is executable to perform and/or control a test of one or more units under test (UUTs). Each step may have a parameter or property configuration that affects execution of the step. Test step parameters or properties may affect or control a wide variety of test aspects, such as whether data-logging is enabled for the test step, whether the step is executed in a loop, etc., as well as product-specific test aspects.

Thus, when executed, test modules corresponding to the steps in the test sequence may be operable to perform a desired sequence of tests on the unit under test. For example, various test modules may interact with instruments that measure and/or control the unit under test. For example, in a manufacturing environment, test executive software may be used to test manufactured products or devices, e.g., by executing various test modules that interact with instruments that measure and/or control the products.

Thus, test executive software operates as the control center for an automated test system. More specifically, the test executive allows the user to create, configure, and/or control test sequence execution for various test applications, such as production and manufacturing test applications. Test executive software typically includes various features, such as test sequencing based on pass/fail results, logging of test results, and report generation, among others.

The following comprises a glossary of test executive nomenclature used herein:

Code Module—A program module, such as a Windows Dynamic Link Library (.dll), Java class file, LabVIEW VI (.vi), etc., that contains one or more functions that perform a specific test or other action.

Test Module—A code module that performs a test.

Step—Any action, such as calling a test module or step module to perform a specific test, that the user can include within a sequence of other actions.

Step Module—The code module that a step calls.

Sequence—A series of steps that the user specifies for execution in a particular order. Whether and when a step is executed can depend on the results of previous steps.

Subsequence—A sequence that another sequence calls. The user specifies a subsequence call as a step in the calling sequence.

Sequence File—A file that contains the definition of one or more sequences.

Sequence Editor—A program that provides a graphical user interface for creating, editing, and debugging sequences.

Run-time Operator Interface—A program that provides a graphical user interface for executing sequences on a production station. A sequence editor and run-time operator interface can be separate application programs or different aspects of the same program.

Test Executive Engine—A module or set of modules that provide an API for creating, editing, executing, and debugging sequences. A sequence editor or run-time execution operator interface uses the services of a test executive engine.

Application Development Environment (ADE)—A programming environment such as LabVIEW, LabWindows/CVI, or Microsoft Visual C++, in which the user can create test modules and run-time operator interfaces.

Unit Under Test (UUT)—A device or component that is being tested; may include software and/or hardware elements.

In the prior art, a user typically creates a particular test sequence for testing a particular product or device. In many cases, however, there may be a product group, wherein the products in the group are very similar or have many similar attributes. For example, devices are often manufactured in different models that vary only slightly from each other. In situations where products in a group share product attributes, substantial portions of the test sequences used to test the products may be the same for each of the products in the group. Thus, it would be desirable to share or reuse test sequences or sequence portions instead of developing a separate test sequence for each product.

For example, in some instances the number of test modules included in a test sequence may range up to the hundreds or more. In such a case, there may be a large duplication of effort in assembling test modules together in the desired order multiple times for separate test sequences. Also, each test module may have associated parameters, and the user may need to configure parameters for each test module multiple times. If a new product needs to be added to the product group, a new test sequence must be developed and maintained. As the number of products in the group increases, this could lead to hundreds of similar test sequences that all have minor differences. If a common parameter needs to be changed then many or all of the test sequences may need to be updated to include the change. This leads to severe maintenance issues.

SUMMARY OF THE INVENTION

One embodiment of the present invention comprises a system and method for testing a group of related products or devices. The products or devices in the group may comprise any of various types of products or devices. For example, it may be desirable to perform computer-controlled testing of various types of manufactured products or devices, e.g., for quality control purposes. The products or devices in the group may be related to each other by sharing any of various types of attributes. As an example of a group of related products, consider a group of data acquisition boards for performing signal input/output. The data acquisition boards in the group may share certain attributes, such as having analog input channels, having the ability to perform analog-to-digital conversion, having the ability to perform analog or digital triggering, etc.

Individual test sequences may be used for testing each particular product in the group of related products. In the preferred embodiment, the user is not required to manually create each individual test sequence. In one embodiment, a base test sequence may be created for the related products, wherein the base test sequence may or may not correspond to a particular product. A plurality of child test sequences may then be created based on the base test sequence, wherein each child test sequence corresponds to a particular product from the group of related products. As described above, since the products have various attributes in common, it may be necessary or desirable for substantial portions of the child test sequences to be the same or to be very similar. Thus, each of the child test sequences may be initially created based on information in the base test sequence that applies to many (or all) of the products in the group. The resulting collection of child test sequences corresponding to the group of related products may be viewed as a "family" of test sequences which simplifies the creation and maintenance of test sequences for testing a group of related products or devices.

Thus, according to one embodiment of a method for testing a group of related products, the user may first manually create the base test sequence. For example, the user may include various steps in the base test sequence, such that the base test sequence includes test steps that need to be executed in most or all of the child test sequences. The user may also configure parameters or properties for each step in the base test sequence, such that the parameter configuration is what is required for most or all of the child test sequences.

The child test sequences may then be created, based on the base test sequence. In one embodiment, each child test sequence may be initially created as an instance of the base test sequence. Each instance of the base test sequence is preferably created automatically from the base test sequence, e.g., a copy of the base test sequence is used to form the instance. Each instance of the base test sequence may comprise steps of the base test sequence, and the steps in the instance initially have the same property or parameter configuration as the steps in the base test sequence. Thus, the child test sequences may initially be the same as (a copy of) the base test sequence.

For each child test sequence, the user may then manually edit the child test sequence as desired in order to configure the child test sequence to appropriately test the particular product to which the child test sequence corresponds. The user may edit the child test sequences in various ways. For example, editing the child test sequence may comprise changing a parameter configuration for one or more steps in the child test sequence. As another example, the user may remove or disable a step in the child test sequence. The user may also edit a child test sequence in any other way desired, such as by adding a new step to the child test sequence, etc. The user may directly edit the child test sequence or use a higher level form of editing, such as using property panels or a wizard.

In the preferred embodiment, the method is further operable to automatically change or update all of the child test sequences in the family in various ways. For example, a new step may need to be added to each child test sequence or to most of the child test sequences. Thus, the user may manually add the new step to the base test sequence, and in response the method may automatically add the new step to each child test sequence, or to user-specified child test sequences. Also, a step may need to be removed from each child test sequence or from most of the child test sequences. Thus, the user may manually remove the step from the base test sequence, and in response the method may automatically remove the step from each child test sequence, or from user-specified child test sequences.

As another example, a parameter configuration for a step in the child test sequences may need to be changed. Thus, the user may manually change the parameter configuration for the corresponding step in the base test sequence, and in response the method may automatically propagate the parameter configuration change to each child test sequence or to user-specified child test sequences.

The functionality described above may be implemented in any of various ways in various embodiments. In one embodiment, it may be useful or necessary to maintain an association between the base test sequence and each child test sequence. In one embodiment, the association between the base test sequence and each child test sequence may be "locked", wherein the locking prevents the user from editing the child test sequence in certain ways. For example, in various implementations it may be necessary to prevent the user from editing a child test sequence in certain ways, so that the child test sequence is structured in a well-known way or is in a known state and can thus be automatically updated in response to changes made to the base test sequence as described above. As an example, in one embodiment the user may be allowed to change a parameter configuration for a step in a child test sequence, but may not be allowed to add a new step to the child test sequence without breaking the association between the base test sequence and the child test sequence. If necessary, the user may override the allowed editing policies in order to configure a certain child test sequence as desired. However, doing so may cause the association between the base test sequence and the child test sequence to be broken or removed, such that the child test sequence can no longer be automatically updated.

In various embodiments, the base test sequence and the child test sequences may be associated with any particular test executive. In one embodiment, the test sequences are constructed as test sequences for the TestStand test executive from National Instruments. The method described above may execute from within the context of a test executive application and/or in conjunction with an add-on tool to a test executive application. For example, a test executive application may provide an API enabling test sequences to be programmatically created or edited. Thus, a "family editor" tool may utilize this API in initially creating child test sequences as instances of a base test sequence, in managing the operations of editing child test sequences as desired by the user, etc. The family editor may provide a graphical user interface enabling the user to specify these operations, as well as to specify modifications to be automatically made to the child test sequences, as described above.

It is noted that various alternative embodiments of the method described above are contemplated. For example, in one embodiment the method may not store actual test sequences in response to the base test sequence, but may instead store information regarding each child test sequence, such that the child test sequence can be programmatically created each time the child test sequence is to be executed. For example, the stored information may comprise meta-information specifying how each child test sequence differs from the actual base test sequence. Storing and manipulating this type of meta-information (e.g., as opposed to actual test sequence files) may enable greater flexibility in the allowed modifications to a child test sequence without breaking the association between a base test sequence and a child test sequence.

The above-described method may provide significant efficiency benefits for the development and maintenance of test software. For example, as new products are developed in a product group, a new child test sequence may initially be automatically created for each new product, based on the base test sequence. The resulting child test sequences may largely include the necessary configured steps and may only require minor alterations. Thus, the user may be saved a significant amount of development time.

BRIEF DESCRIPTION OF THE DRAWINGS

A better understanding of the present invention can be obtained when the following detailed description of the preferred embodiment is considered in conjunction with the following drawings, in which.

Figure 1:
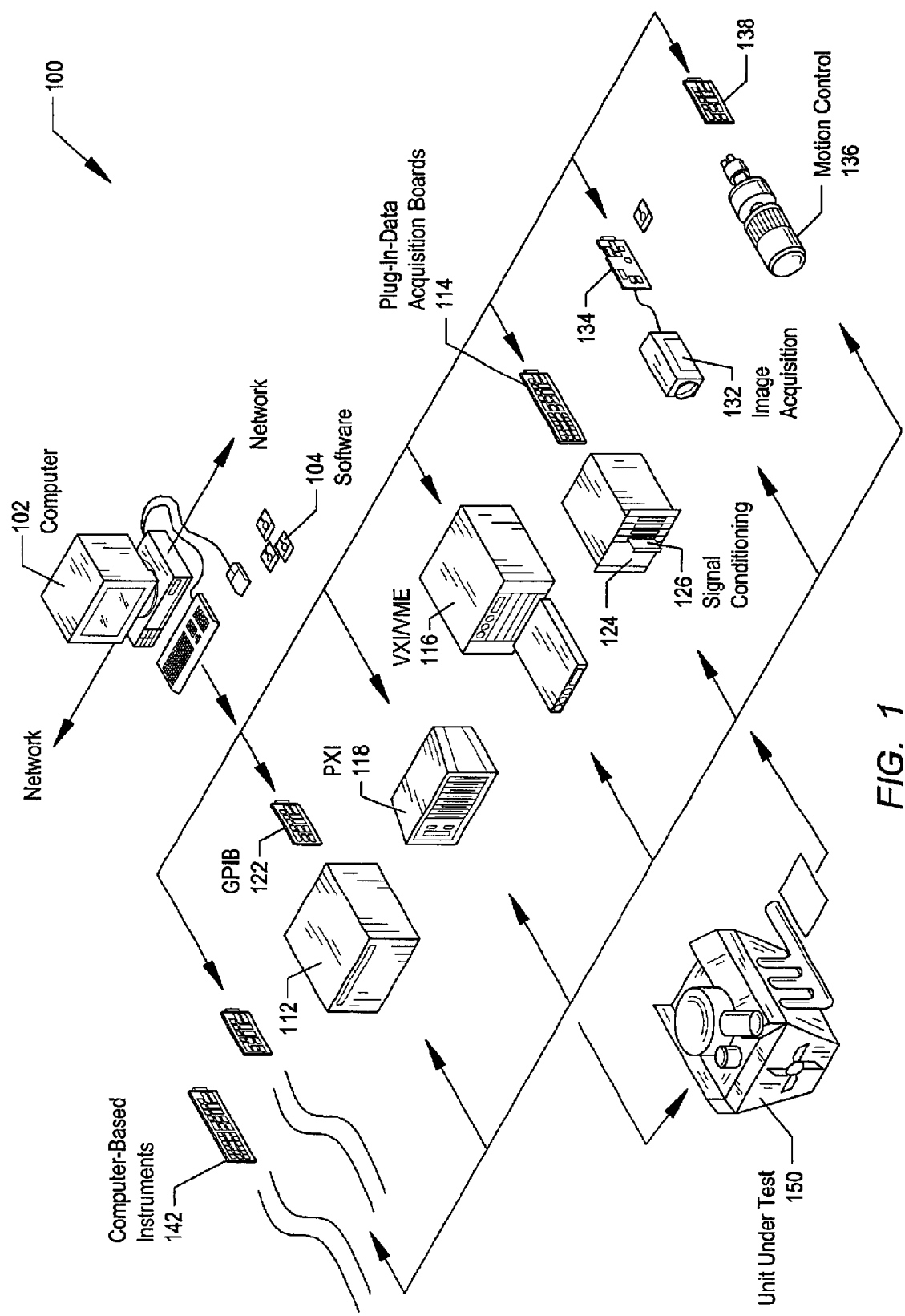
FIG. 1 illustrates an instrumentation control system according to one embodiment of the present invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Incorporation by Reference

The following references are hereby incorporated by reference in their entirety as though fully and completely set forth herein.

U.S. Pat. No. 6,401,220 titled "Test Executive System and Method Including Step Types for Improved Configurability," issued Jun. 4, 2002.

FIG. 1—Instrumentation System

FIG. 1 illustrates an examplary instrumentation control system 100. The system 100 comprises a host computer 102 which connects to one or more instruments. The host computer 102 comprises a CPU, a display screen, memory, and one or more input devices such as a mouse or keyboard as shown. The computer 102 may connect through the one or more instruments to analyze, measure or control a unit under test (UUT) or process 150. For example, the computer 102 may include a test executive application for performing automated tests of the unit under test. As described below, the unit under test may be a product or device from a group of related products or devices. It is noted that FIG. 1 is exemplary only, and the present invention may be used in any of various systems, as desired.

The one or more instruments may include a GPIB instrument 112 and associated GPIB interface card 122, a data acquisition board 114 and associated signal conditioning circuitry 124, a VXI instrument 116, a PXI instrument 118, a video device 132 and associated image acquisition card 134, a motion control device 136 and associated motion control interface card 138, and/or one or more computer based instrument cards 142, among other types of devices.

The GPIB instrument 112 is coupled to the computer 102 via a GPIB interface card 122 provided by the computer 102. In a similar manner, the video device 132 is coupled to the computer 102 via the image acquisition card 134, and the motion control device 136 is coupled to the computer 102 through the motion control interface card 138. The data acquisition board 114 is coupled to the computer 102, and optionally interfaces through signal conditioning circuitry 124 to the UUT. The signal conditioning circuitry 124 preferably comprises an SCXI (Signal Conditioning extensions for Instrumentation) chassis comprising one or more SCXI modules 126.

The GPIB card 122, the image acquisition card 134, the motion control interface card 138, and the DAQ card 114 are typically plugged in to an I/O slot in the computer 102, such as a PCI bus slot, a PC Card slot, or an ISA, EISA or MicroChannel bus slot provided by the computer 102. However, these cards 122, 134, 138 and 114 are shown external to computer 102 for illustrative purposes. The cards 122, 134, 138 and 114 may also be implemented as external devices coupled to the computer 102, such as through a serial bus.

The VXI chassis or instrument 116 is coupled to the computer 102 via a serial bus, MXI bus, or other serial or parallel bus provided by the computer 102. The computer 102 preferably includes VXI interface logic, such as a VXI, MXI or GPIB interface card (not shown), which interfaces to the VXI chassis 116. The PXI chassis or instrument is preferably coupled to the computer 102 through the computer's PCI bus.

A serial instrument (not shown) may also be coupled to the computer 102 through a serial port, such as an RS-232 port, USB (Universal Serial bus) or IEEE 1394 or 1394.2 bus, provided by the computer 102. In typical instrumentation control systems an instrument will not be present of each interface type, and in fact many systems may only have one or more instruments of a single interface type, such as only GPIB instruments.

The instruments are coupled to the unit under test (UUT) or process 150, or are coupled to receive field signals, typically generated by transducers. Other types of instruments or devices may be connected to the system, as desired.

The computer system 102 preferably includes a memory medium on which one or more computer programs according to the present invention are stored. The memory medium may store test executive software for creating and/or controlling an automated test system. The test executive software may allow the user to create, configure, and/or control test sequence execution for various test applications, such as production and manufacturing test applications. As described below, the test executive software may provide support for creating a family of test sequences for testing a group of related products or devices. In another embodiment, another application, e.g., a family editor add-on tool that interfaces with the test executive software, may implement the below-described methods for maintaining the test sequence family.

The term "memory medium" is intended to include an installation media, e.g., a CD-ROM, or floppy disks 104, a computer system memory such as DRAM, SRAM, EDO RAM, etc., or a non-volatile memory such as a magnetic medium, e.g., a hard drive, or optical storage. The host computer CPU executing code and data from the memory medium may comprise a means for creating and maintaining a test sequence family to test a group of related products or devices according to the methods described below.

Test Executive Software Components

Figure 2:
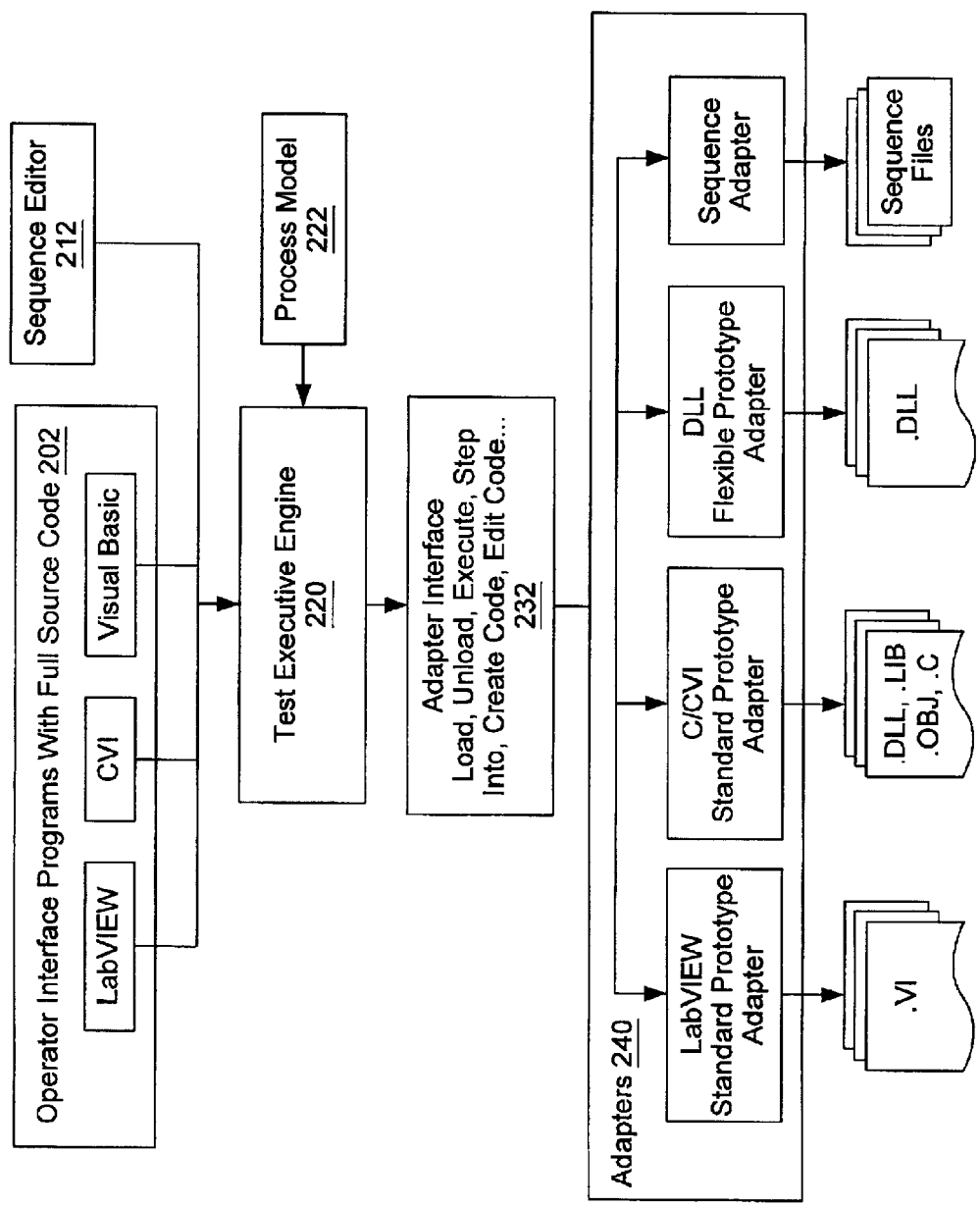
FIG. 2 illustrates a test executive application software architecture according to one embodiment of the present invention.

FIG. 2 is a block diagram illustrating high-level architectural relationships between elements of one embodiment of a test executive software application. It is noted that FIG. 2 is exemplary, and the present invention may be utilized in conjunction with any of various test executive software applications. In one embodiment, the elements of FIG. 2 are comprised in the TestStand test executive product from National Instruments. As shown, the test executive software of FIG. 2 includes operator interface programs 202 for interfacing to various software programs. The operator interface programs 202 shown in FIG. 2 are for interfacing to the LabVIEW, LabWindows CVI, and Visual Basic programs. However, additional operator interface programs 202 may be included for interfacing to other programs.

The test executive software of FIG. 2 also includes a sequence editor 212 for editing sequences. The sequence editor 212 and the operator interface programs 202 interface to the test executive engine 220. One or more process models 222 couple to the test executive engine 220. The test executive engine 220 interfaces through an adapter interface 232 to one or more adapters 240. The adapters shown in FIG. 2 include the LabVIEW standard prototype adapter, the C/CVI prototype adapter, the DLL flexible prototype adapter, and the sequence adapter. The LabVIEW standard prototype adapter interfaces to programs having a VI extension, i.e., LabVIEW graphical programs. The C/CVI prototype adapter interfaces to programs having a .dll, lib, .obj, or .c extension. The DLL flexible prototype adapter interfaces to programs having a .dll extension. The sequence adapter interfaces to sequence file programs.

As shown in FIG. 2, the test executive engine 220 plays a pivotal role in the test executive architecture. The test executive engine 220 runs sequences. Sequences comprise steps that can call external code modules. By using module adapters 240 that have the standard adapter interface 232, the test executive engine 220 can load and execute different types of code modules. Test executive sequences can call sub-sequences through the common adapter interface 232. The test executive may use a special type of sequence called a process model to direct the high-level sequence flow. The test executive engine 220 exports an ActiveX Automation API used by the sequence editor 212 and run-time operator interfaces 202.

Test Executive Sequence Editor

The sequence editor 212 is an application program in which the user creates, modifies, and debugs sequences. As described below, the user may utilize the sequence editor 212 to interactively create a base test sequence for a family of test sequences, and initial child test sequences may then be automatically generated, based on the base test sequence.

The sequence editor 212 provides the user easy access to the test executive features, such as step types and process models. The sequence editor 212 may include debugging tools found in application development environments such as LabVIEW, LabWindows/CVI, and Microsoft Visual C/C++. These may include features such as breakpoints, single stepping, stepping into or over function calls, tracing, a variable display, and a watch window.

In one embodiment, in the sequence editor 212, the user may start multiple concurrent executions. Multiple instances of the same sequence can be executed, and different sequences can be executed at the same time. Each execution instance has its own execution window. In trace mode, the execution window displays the steps in the currently executing sequence. When execution is suspended, the execution window may displays the next step to execute and provide single-stepping options.

Test Executive Engine

The test executive engine 220 may be used for creating, editing, executing, and debugging sequences. The test executive engine 220 may also provide an application programming interface (API) that enables another program to interface with the test executive engine 220 in order to perform these actions. In one embodiment, the test executive engine 220 comprises a set of DLLs that export an object-based or component-based API, preferably an ActiveX Automation API. The sequence editor 212 and runtime operator interfaces 202 may use the Test Executive Engine API (Engine API). In one embodiment, the Engine API may be called from any programming environment that supports access to ActiveX Automation servers. Thus, the Engine API may be called from test modules, including test modules that are written in LabVIEW and LabWindows/CVI, Visual C++, etc.

Figure 3:
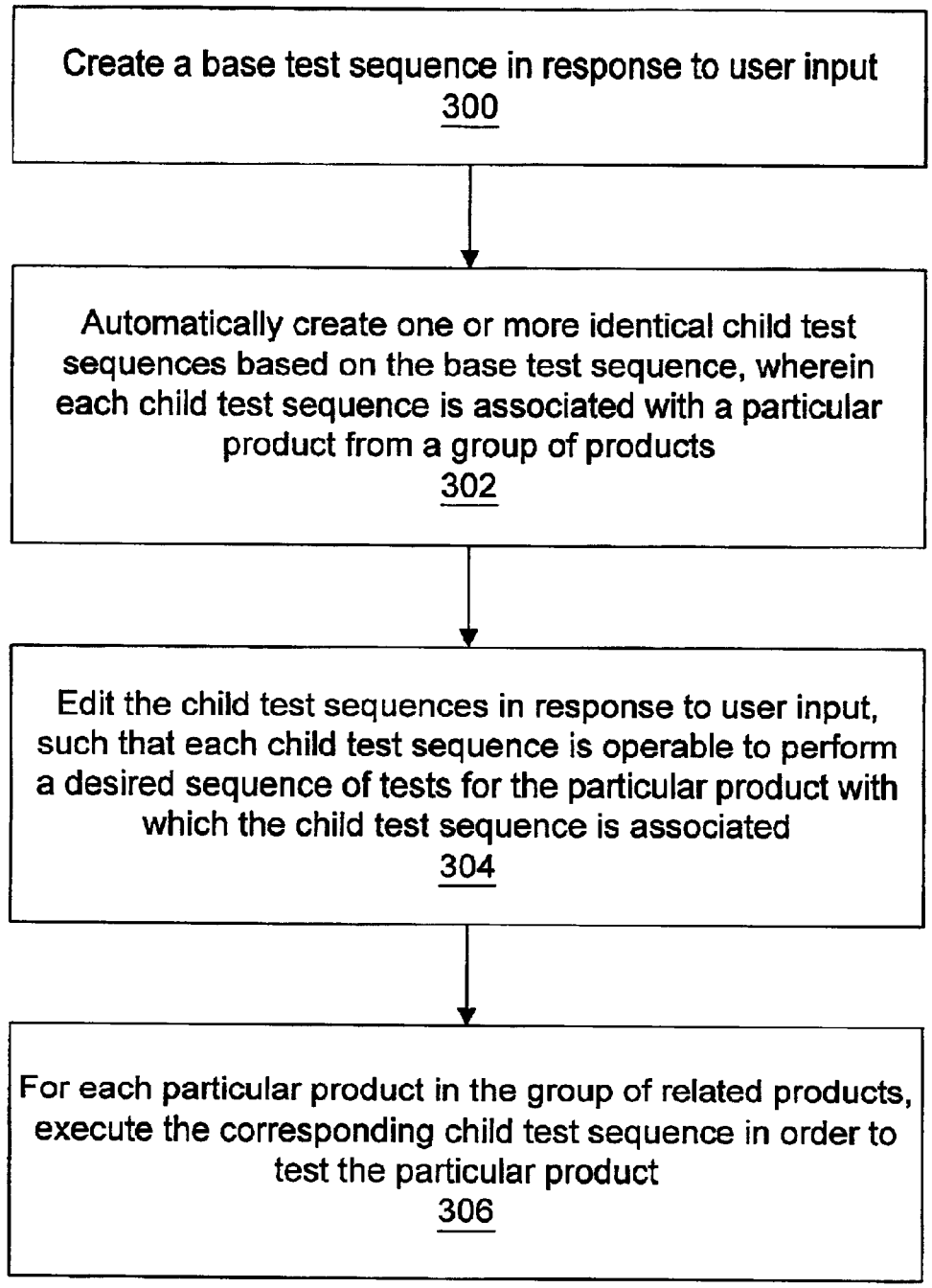
FIG. 3 is a flowchart diagram illustrating one embodiment of a method for testing a group of related products or devices.

FIG. 3—Testing a Group of Related Products

FIG. 3 is a flowchart diagram illustrating one embodiment of a method for testing a group of related products or devices. The products or devices in the group may comprise any of various types of products or devices. For example, it may be desirable to perform computer-controlled testing of various types of manufactured products or devices, e.g., for quality control purposes. The products or devices in the group may be related to each other by sharing any of various types of attributes. As an example of a group of related products, consider a group of data acquisition boards for performing signal input/output. The data acquisition boards may share certain attributes, such as having analog input channels, having the ability to perform analog-to-digital conversion, having the ability to perform analog or digital triggering, etc.

Individual test sequences may be used for testing each particular product in the group of related products. Each test sequence may comprise a series of steps, wherein each step references a test module, and wherein each test module is executable to perform and/or control a test of a unit under test, i.e., a particular product or device to which the test sequence corresponds. Thus, when executed, test modules corresponding to the steps may be operable to perform a desired sequence of tests on the unit under test. For example, various test modules may interact with instruments that measure and/or control the unit under test, in order to test the unit under test.

Each test step may have a parameter configuration that affects execution of the step. Test step parameters or properties may affect or control a wide variety of test aspects, such as whether data-logging is enabled for the test step, whether the step is executed in a loop, etc., as well as product-specific test aspects.

Although there may be individual test sequences for testing each particular product in the group of related products, the user is preferably not required to manually create each individual test sequence, as described below. The collection of test sequences corresponding to the group of related products may be viewed as a family of test sequences. In step 300, a base test sequence may be created in response to user input. For example, the sequence editor 212 described above may be used in creating the base test sequence. The user may include various steps in the base test sequence, such that the base test sequence includes steps that need to be common to most or all of the child test sequences. The user may also configure parameters or properties for each step in the base test sequence, such that the parameter configuration is what is required for most or all of the child test sequences.

In step 302, initial child test sequences may be automatically, i.e., programmatically, created, based on the base test sequence. In one embodiment, each child test sequence may be initially created as an instance of the base test sequence. Each instance of the base test sequence may comprise steps of the base test sequence, and the steps in the instance may be automatically created or configured to have the same property or parameter configuration as the steps in the base test sequence. Thus, each child test sequence may initially be the same as the base test sequence. In one embodiment, the test sequences may be associated with a particular test executive, and that test executive may provide an application programming interface (API) such as described above which enables the programmatic creation/configuration of test sequences.

In step 304, for each child test sequence, the user may then manually edit the child test sequence in order to configure the child test sequence to appropriately test the particular product with which the child test sequence is associated. The user may edit the child test sequences in various ways. For example, editing the child test sequence may comprise changing a parameter configuration for one or more steps in the child test sequence. As another example, the user may remove or disable a step in the child test sequence. The user may also edit a child test sequence in any other way desired, such as by adding a new step to the child test sequence, etc.

In step 306, the group of related products or devices may be tested. For each particular product or device in the group of related products or devices, the child test sequence corresponding to the particular product or device may be executed in order to test the particular product or device. For a manufacturing application, this may involve executing the child test sequence multiple times, e.g., to test multiple units on an assembly line.

The above-described method may provide significant efficiency benefits for the development of test software. For example, as a new product is developed in a product group, an initial new child test sequence may be automatically created for the new product, based on the base test sequence. The resulting child test sequence may largely include the necessary configured steps and may only require minor alterations. Thus, the user may be saved a significant amount of development time.

It is noted that various alternative embodiments of the method described above are contemplated. For example, in one embodiment the method may not store actual test sequences in response to the base test sequence, but may instead store information regarding each child test sequence, such that the child test sequence can be programmatically created each time the child test sequence is to be executed. For example, the stored information may comprise meta-information specifying how each child test sequence differs from the actual base test sequence.

Initial Creation of Child Test Sequences (Step 302)

In various embodiments, step 302 (creating initial child test sequences as instances of the base test sequence) may be performed in various ways. The base test sequence instances may be created together or separately. In one embodiment, the user may utilize a graphical user interface to request that a new child test sequence be added to a family of test sequences. For example, the user may provide information regarding the new child test sequence, such as a product name to which the child test sequence corresponds, a filename for the child test sequence, etc. In response, the new child test sequence may be initially created as an instance of the base test sequence. Thus, in this case, child test sequences may be created separately.

Figure 4:
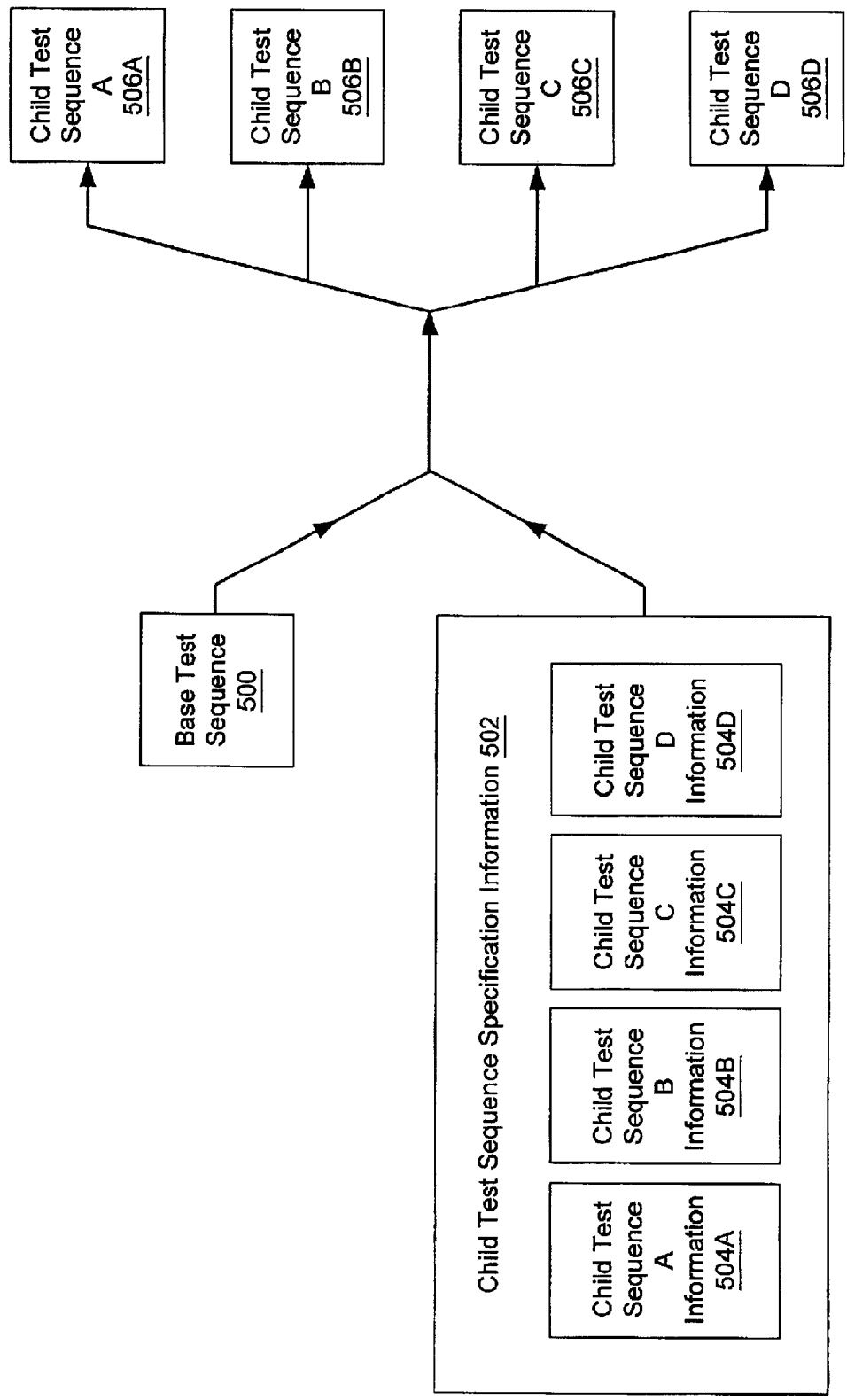
FIG. 4 illustrates an embodiment in which child test sequences are created together as a batch, based on a base test sequence and child test sequence specification information.

In another embodiment, child test sequences may be created together as a batch. For example, as illustrated in FIG. 4, the user may provide child test sequence specification information 502. The specification information 502 may comprise one or more portions of information 504, wherein each portion of information 504 specifies information regarding a particular child test sequence to be created. For example, the portions of information 504 may be stored as a record in a file or database. The method may then operate to automatically create a new child test sequence 506 for each portion of information 504, wherein the new child test sequences 506 are based on a base test sequence 500.

In one embodiment, each portion of information 504 may only specify information such as a desired filename for the child test sequence, a product name to which the child test sequence corresponds, etc. This may result in a set of identical child test sequences 506, which are instances of the base test sequence 500. The user may then provide input to differentiate each of these child test sequences, as described above. In another embodiment, the portions of information 504 may specify additional information which can be used in creating a final (or more complete) set of child test sequences. For example, in addition to information such as a desired test sequence filename, a portion of information 504 may also comprise information specifying a step to be added to the steps of the base test sequence, a desired parameter value for the child test sequence which differs from a parameter value in the base test sequence, etc. Thus, in one embodiment, step 304 of FIG. 3 (manually editing the initial child test sequences to produce the final configured child test sequences) may not be necessary or may be simplified.

Figure 5:
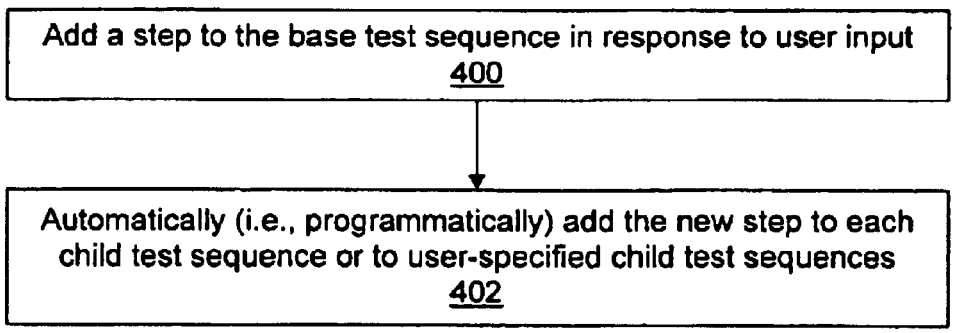
FIGS. 5–7 are flowchart diagrams illustrating methods for automatically updating child test sequences.
Figure 6:
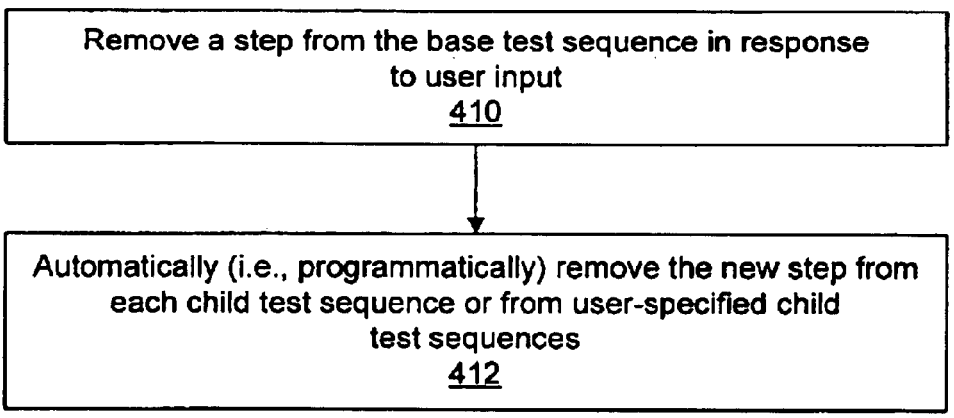
Figure 7:
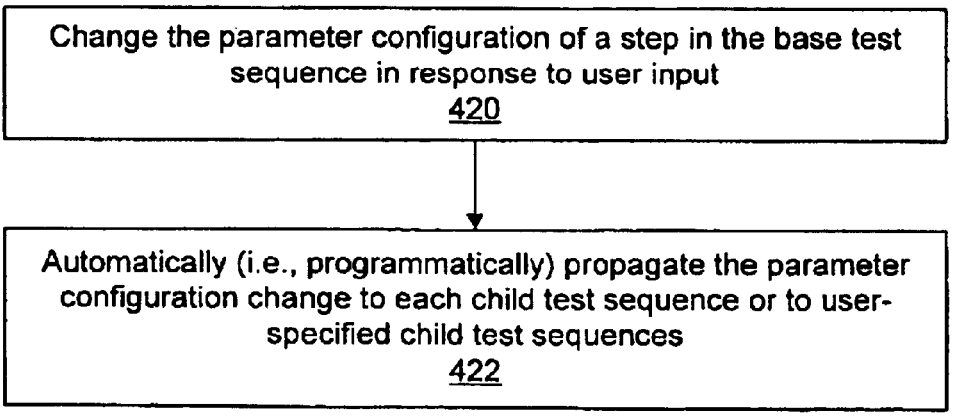

FIGS. 5–7: Automatically Updating Child Test Sequences

In the preferred embodiment, the child test sequences may be automatically, i.e., programmatically changed or updated in various ways. FIGS. 5–7 are flowchart diagrams illustrating methods for automatically updating child test sequences.

In step 400 of FIG. 5, a step may be added to the base test sequence in response to user input. In response, in step 402 of FIG. 5, the new step may be automatically, i.e., programmatically added to each child test sequence or to user-specified child test sequences. The step added to the base test sequence may have an associated parameter configuration, and the steps in the child test sequences may be created such that they have the same parameter configuration.

In step 410 of FIG. 6, a step may be removed from the base test sequence in response to user input. In response, in step 412 of FIG. 6, the step may be automatically, i.e., programmatically removed from each child test sequence or from user-specified child test sequences.

In step 420 of FIG. 7, the parameter configuration of a step in the base test sequence may be changed in response to user input. In response, in step 422 the parameter configuration change may be automatically propagated to each child test sequence or to user-specified child test sequences.

The functionality described above may be implemented in any of various ways in various embodiments. In one embodiment, it may be useful or necessary to maintain an association between the base test sequence and each child test sequence. The association between the base test sequence and each child test sequence may be "locked", wherein the locking prevents the user from editing the child test sequence in various ways. For example, in one embodiment the user may be allowed to change a parameter configuration for a step in a child test sequence, but may not be allowed to add a new step to the child test sequence without breaking the association between the base test sequence and the child test sequence. For example, in various implementations it may be necessary to prevent the user from editing a child test sequence in certain ways, so that the child test sequence is structured in a well-known way or is in a known state and can thus be automatically updated in response to changes made to the base test sequence as described above. If necessary, the user may need to override the allowed editing policies in order to configure a certain child test sequence as desired. However, doing so may cause the association between the base test sequence and the child test sequence to be broken or removed, such that the child test sequence can no longer be automatically updated.

In various embodiments, the base test sequence and the child test sequences may be associated with any particular test executive. In one embodiment, the test sequences are constructed as test sequences for the TestStand test executive from National Instruments. The method described above may execute from within the context of a test executive application and/or in conjunction with an add-on tool to a test executive application. For example, a test executive application may provide an API for programmatically creating and changing test sequences. Thus, a "family editor" tool may utilize this API in creating child test sequences from a base test sequence, etc.

The family editor may enable the user to automatically update child test sequences as described above, may manage the act of editing child test sequences as desired by the user, etc. For example, the family editor may have a graphical user interface (GUI) enabling the user to perform actions such as: requesting that one or more child sequences be automatically generated based on a base test sequence, associating a child test sequence with a particular product or device, changing the base test sequence and automatically propagating the changes to child test sequences, editing child test sequences, etc.

In various embodiments, the family editor may maintain any of various types of information which enables the family editor to track current states of the child test sequences, maintain associations between a base test sequence and its child test sequences, etc. For example, consider a situation in which a user edits a child test sequence by changing a parameter for one of the steps in the child test sequence to a new value of "X". The family editor may maintain information indicating that this parameter was manually changed. If the user then updates the same parameter in the base test sequence to a new value of "Y", then the family editor may automatically change the corresponding parameter for each child test sequence to "Y", e.g., by calling a test executive API to perform the change. However, since the parameter was manually changed to "X" for one of the child test sequences, the family editor may not change the parameter for this child test sequence. The GUI for the family editor may allow the user to override any manual parameter changes with the parameter update, if desired.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A method for testing a group of related physical products, the method comprising:

creating a base test sequence in response to user input, wherein the base test sequence comprises a plurality of test steps and defines an order of execution for the test steps, wherein the base test sequence is operable to be executed by a test executive engine;

creating one or more instances of the base test sequence, wherein each instance of the base test sequence comprises the plurality of test steps of the base test sequence;

for each of the one or more instances of the base test sequence, modifying the instance in response to user input to produce one or more child test sequences configured for testing a particular physical product from the group of related physical products, wherein the one or more child test sequences are operable to be executed by the test executive engine.

2. The method of claim 1, further comprising:

executing a child test sequence configured for testing a particular physical product, wherein said executing the child test sequence comprises executing steps in the child test sequence, wherein each step performs a test of the particular physical product, wherein said executing the child test sequence comprises executing the child test sequence using the test executive engine.

3. The method of claim 1, wherein one or more steps of the base test sequence have an associated parameter configuration;

wherein said modifying the instance in response to user input comprises changing a parameter configuration for one or more steps in the instance.

4. The method of claim 1, wherein said modifying the instance in response to user input comprises removing a step from the instance.

5. The method of claim 1, further comprising:

adding a new step to the base test sequence in response to user input, subsequently to said creating the one or more instances of the base test sequence;

automatically adding the new step to the one or more child test sequences, in response to said adding the new step to the base test sequence.

6. The method of claim 1, further comprising:

removing a step from the base test sequence in response to user input, subsequently to said creating the one or more instances of the base test sequence;

automatically removing the step from the one or more child test sequences, in response to said removing the step from the base test sequence.

7. The method of claim 1, wherein a step in the base test sequence has an associated parameter configuration, the method further comprising:

changing the parameter configuration in response to user input, subsequently to said creating the one or more instances of the base test sequence;

automatically propagating the parameter configuration change to the one or more child test sequences, in response to said changing the parameter configuration.

8. A method for testing a group of related physical products, the method comprising:

creating a base test sequence in response to user input, wherein the base test sequence comprises a plurality of test steps and defines an order of execution for the test steps, wherein the base test sequence is operable to be executed by a test executive engine;

receiving user input specifying information regarding a desired plurality of child test sequences, wherein the information comprises information specifying how each desired child test sequence differs from the base test sequence;

creating the desired plurality of child test sequences based on the base test sequence and the information regarding the desired plurality of child test sequences, wherein the plurality of child test sequences are operable to be executed by the test executive engine.

9. The method of claim 8,
wherein said creating the desired plurality of child test sequences comprises programmatically creating the desired plurality of child test sequences based on the base test sequence and the information regarding the desired plurality of child test sequences.

10. The method of claim 8,
wherein said creating the desired plurality of child test sequences comprises
executing sequence editor;
wherein the sequence editor accesses the base test sequence and the information regarding the desired plurality of child test sequences and programmatically creates the desired plurality of child test sequences based on the base test sequence and the information regarding the desired plurality of child test sequences.

11. A memory medium comprising program instructions for testing a group of related physical products, wherein the program instructions are executable to implement:
creating a base test sequence in response to user input, wherein the base test sequence comprises a plurality of test steps and defines an order of execution for the test steps, wherein the base test sequence is operable to be executed by a test executive engine;
creating one or more instances of the base test sequence, wherein each instance of the base test sequence comprises the plurality of test steps of the base test sequence;
for each of the one or more instances of the base test sequence, modifying the instance in response to user input to produce one or more child test sequences configured for testing a particular physical product from the group of related physical products, wherein the one or more child test sequences are operable to be executed by the test executive engine.

12. The memory medium of claim 11, wherein the program instructions are further executable to implement;
executing a child test sequence configured for testing a particular physical product, wherein said executing the child test sequence comprises executing steps in the child test sequence, wherein each step performs a test of the particular physical product;
wherein said executing the child test sequence comprises executing the child test sequence using the test executive engine.

13. The memory medium of claim 11,
wherein one or more steps of the base test sequence have an associated parameter configuration;
wherein said modifying the instance in response to user input comprises changing a parameter configuration for one or more steps in the instance.

14. The memory medium of claim 11,
wherein said modifying the instance in response to user input comprises removing a step from the instance.

15. The memory medium of claim 11, wherein the program instructions are further executable to implement:
adding a new step to the base test sequence in response to user input, subsequently to said creating the one or more instances of the base test sequence;
automatically adding the new step to the one or more child test sequences, in response to said adding the new step to the base test sequence.

16. The memory medium of claim 11, wherein the program instructions are further executable to implement:
removing a step from the base test sequence in response to user input, subsequently to said creating the one or more instances of the base test sequence;
automatically removing the step from the one or more child test sequences, in response to said removing the step from the base test sequence.

17. The memory medium of claim 11, wherein a step in the base test sequence has an associated parameter configuration, the method further comprising:
changing the parameter configuration in response to user input, subsequently to said creating the one or more instances of the base test sequence;
automatically propagating the parameter configuration change to the one or more child test sequences, in response to said changing the parameter configuration.

18. A memory medium comprising program instructions for testing a group of related physical products, wherein the program instructions are executable to implement:
creating a base test sequence in response to user input, wherein the base test sequence comprises a plurality of test steps and defines an order of execution for the test steps, wherein the base test sequence is operable to be executed by a test executive engine;
receiving user input specifying information regarding a desired plurality of child test sequences, wherein the information comprises information specifying how each desired child test sequence differs from the base test sequence;
creating the desired plurality of child test sequences based on the base test sequence and the information regarding the desired plurality of child test sequences, wherein the plurality of child test sequences are operable to be executed by the test executive engine.

19. The memory medium of claim 18,
wherein said creating the desired plurality of child test sequences comprises programmatically creating the desired plurality of child test sequences based on the base test sequence and the information regarding the desired plurality of child test sequences.

20. The memory medium of claim 18,
wherein said creating the desired plurality of child test sequences comprises
executing a sequence editor;
wherein the sequence editor accesses the base test sequence and the information regarding the desired plurality of child test sequences and programmatically creates the desired plurality of child test sequences based on the base test sequence and the information regarding the desired plurality of child test sequences.

21. A memory medium comprising programs for testing a group of related physical products, wherein the memory medium stores:
a base test sequence created in response to user input, wherein the base test sequence comprises a plurality of test steps and defines an order of execution for the test steps, wherein the base test sequence is operable to be executed by a test executive engine;
one or more instances of the base test sequence, wherein each instance of the base test sequence comprises the plurality of test steps of the base test sequence; and
one or more child test sequences, wherein each of the one or more child test sequences is created from a corresponding one of the one or more instances, wherein the one or more child test sequence are operable to be executed by the test executive engine;

wherein each of the one or more child test sequences are configured for testing a particular physical product from the group of related physical products.

22. A memory medium comprising programs for testing a group of related physical products, wherein the memory medium stores:

a base test sequence created in response to user input, wherein the base test sequence comprises a plurality of test steps and defines an order of execution for the test steps, wherein the base test sequence is operable to be executed by a test executive engine;

information regarding a desired plurality of child test sequences, wherein the information comprises information specifying how each desired child test sequence differs from the base test sequence, wherein the information is created in response to user input; and a sequence editor that is operable to programmatically create the desired plurality of child test sequences based on the base test sequence and the information regarding the desired plurality of child test sequences, wherein the desired plurality of child test sequences are operable to be executed by the test executive engine.

* * * * *